(12) United States Patent
Cheng et al.

(10) Patent No.: US 7,812,433 B2
(45) Date of Patent: Oct. 12, 2010

(54) PACKAGE STRUCTURE AND ELECTRONIC DEVICE USING THE SAME

(75) Inventors: Mi-Cheng Cheng, Tainan (TW); Kuo-Hua Chen, Penghu (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 217 days.

(21) Appl. No.: 12/078,076

(22) Filed: Mar. 27, 2008

(65) Prior Publication Data

US 2008/0290489 A1  Nov. 27, 2008

(30) Foreign Application Priority Data

May 24, 2007   (TW) ............... 96118601 A

(51) Int. Cl.
*H01L 23/02* (2006.01)
(52) U.S. Cl. ............... 257/680; 257/713; 257/719; 257/E23.104; 257/E23.182; 257/E23.192
(58) Field of Classification Search ............... 257/680, 257/713, 719, E23.104, E23.182, E23.192
See application file for complete search history.

(56) References Cited

U.S. PATENT DOCUMENTS

| 5,646,828 A * | 7/1997 | Degani et al. ............... 361/715 |
| 5,856,911 A * | 1/1999 | Riley ............... 361/704 |
| 6,564,454 B1 * | 5/2003 | Glenn et al. ............... 29/852 |
| 2003/0231842 A1 * | 12/2003 | Kropp ............... 385/92 |
| 2004/0241417 A1 * | 12/2004 | Fischer et al. ............... 428/317.9 |
| 2006/0022290 A1 * | 2/2006 | Chen et al. ............... 257/432 |
| 2007/0210246 A1 * | 9/2007 | Ellenberger et al. ............... 250/239 |
| 2008/0048120 A1 * | 2/2008 | Gooch ............... 250/338.4 |

\* cited by examiner

*Primary Examiner*—Tu-Tu V Ho
(74) *Attorney, Agent, or Firm*—Bacon & Thomas, PLLC

(57) ABSTRACT

A package structure and an electronic device using the same are provided. The package structure includes a chip module and a cover. The chip module covered by the cover is used for receiving a first signal. The chip module includes a substrate, a heat sink and a first chip. The substrate has a first surface, a second surface and an opening. The first surface is opposite to the second surface. The opening penetrates the first surface and the second surface. The heat sink is disposed on the first surface of the substrate and covers the opening. The first chip is disposed on the heat sink and is positioned inside the opening. A bottom surface of the first chip flatly contacts the heat sink. The cover has a window element. The first signal passes through the window element to contact with the chip module.

14 Claims, 1 Drawing Sheet

PACKAGE STRUCTURE AND ELECTRONIC DEVICE USING THE SAME

This application claims the benefit of Republic of Taiwan application Serial No. 096118601, filed May 24, 2007, the subject matter of which is incorporated herein by reference.

BACKGROUND OF THE INVENTION

1. Field of the Invention

The invention relates in general to a package structure and an electronic device using the same, and more particularly to a package structure for receiving a first signal and an electronic device using the same.

2. Description of the Related Art

Currently, projectors are classified into liquid crystal display (LCD) projectors, digital light processing (DLP) projectors and cathode ray tube (CRT) projectors.

As an example, digital micro-mirror devices are material for DLP to project an image. Referring to FIG. 1, FIG. 1 illustrates a conventional digital micro-mirror device. The digital micro-mirror device 100 includes a substrate 110, a heat sink 120, a sealant 130, a glass structure 160 and a chip 140. The substrate 110 has an opening 113. The heat sink 120 covers the opening 113. The heat sink 120 is used for carrying the chip 140 and dissipating the heat generated by the chip 140. The glass structure 160 is disposed above the chip 140. The sealant 130 covers the chip 140, the glass structure 160 and the substrate 110.

The light 150 passes through the sealant 130 and the glass structure 160 to contact with the chip 140. The surface of the sealant 130 is usually unsmooth due to the material characteristics, so that the light 150 is normally reflected or scattered when passing through the sealant 130 and the glass structure 160. Under such circumstances, the quality of imaging is affected.

SUMMARY OF THE INVENTION

The invention is directed to a package structure and an electronic device using the same. By enabling a first signal to pass through a cover, the first signal would not be scattered or reflected, hence enhancing the optical performance of the package structure and the electronic device using the same.

According to a first aspect of the present invention, a package structure including a chip module and a cover is provided. The chip module including a substrate, a heat sink and a first chip is used for receiving a first signal. The substrate has a first surface, a second surface and an opening. The first surface is opposite to the second surface. The opening penetrates the first surface and the second surface. The heat sink is disposed on the first surface of the substrate and covers the opening. The first chip is disposed on the heat sink and is positioned inside the opening. A bottom surface of the first chip flatly contacts the heat sink. The cover having a window element covers the chip module. The first signal passes through the window element to contact with the chip module.

According to a second aspect of the present invention, an electronic device including a first signal source and a package structure is provided. The first signal source is used for providing a first signal. The package structure includes a chip module and a cover. The chip module including a substrate, a heat sink and a first chip is used for receiving the first signal. The substrate has a first surface, a second surface and an opening. The first surface is opposite to the second surface. The opening penetrates the first surface and the second surface. The heat sink is disposed on the first surface of the substrate and covers the opening. The first chip is disposed on the heat sink and is positioned inside the opening. A bottom surface of the first chip flatly contacts the heat sink. The cover having a window element covers the chip module. The first signal passes through the window element to contact with the chip module.

The invention will become apparent from the following detailed description of the preferred but non-limiting embodiments. The following description is made with reference to the accompanying drawings.

DETAILED DESCRIPTION OF THE INVENTION

Figure 1:
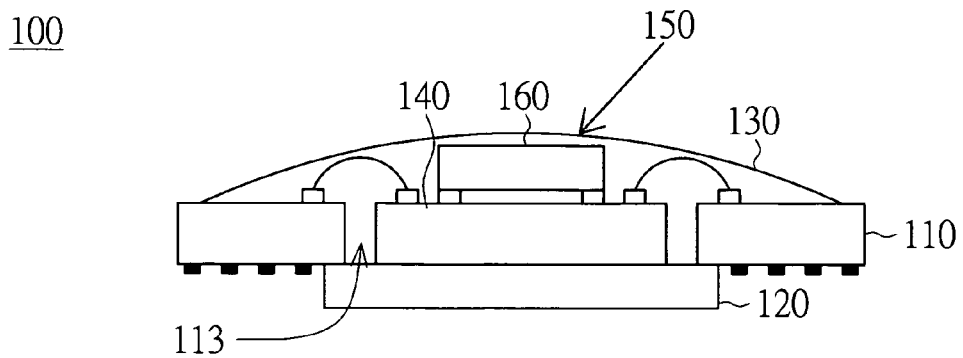
FIG. 1 (Prior Art) illustrates a conventional digital micro-mirror device.
Figure 2:
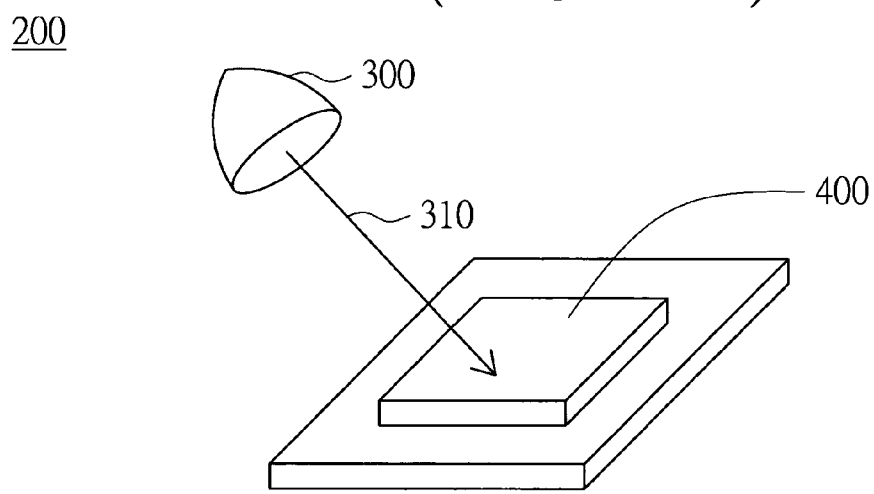
FIG. 2 illustrates an electronic device according to a preferred embodiment of the invention.
Figure 3:
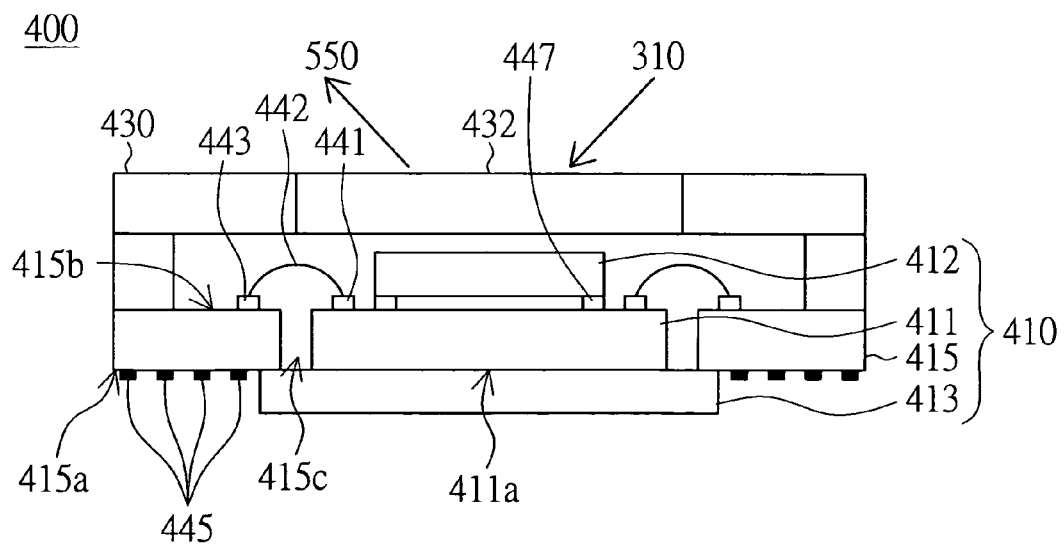
FIG. 3 illustrates a package structure in FIG. 2.

Referring to both FIG. 2 and FIG. 3. FIG. 2 illustrates an electronic device according to a preferred embodiment of the invention. FIG. 3 illustrates a package structure in FIG. 2. The electronic device 200 includes a first signal source 300 and a package structure 400. The first signal source 300 is used for providing a first signal 310. The package structure 400 includes a chip module 410 and a cover 430 (illustrated in FIG. 3). The chip module 410 is used for receiving the first signal 310. The cover 430 having a window element 432 covers the chip module 410. The first signal 310 passes through the window element 432 to contact with the chip module 410.

In the present embodiment of the invention, the window element 432 is a plate structure with a smooth surface, so that the first signal 310 would not be scattered or reflected when passing through the window element 432, hence increasing the utilization rate of the first signal 310. In addition, the first signal source 300 is a light source and the first signal 310 is light, for example.

The electronic device 200 in FIG. 2 is, for example, a digital projector. As indicated in FIG. 3, the chip module 410 of the package structure 400 includes a substrate 415, a heat sink 413, a first chip 411 and a second chip 412. The substrate 415 has a first surface 415a, a second surface 415b and an opening 415c. The first surface 415a is opposite to the second surface 415b. The opening 415c penetrates the first surface 415a and the second surface 415b. The substrate 415 can be, for example, a printed circuit board (PCB) or a bismaleimide triazine (BT) board, and the package structure 400 can be a land grid array (LGA) package structure or a ball grid array (BGA) package structure.

The heat sink 413 is disposed on the first surface 415a of the substrate 415 and covers the opening 415c. The first chip 411 is disposed on the heat sink 413 and positioned inside the opening 415c. A bottom surface 411a of the first chip 411 flatly contacts the heat sink 413. The heat sink 413 is used for dissipating the heat generated by the first chip 411.

In the present embodiment of the invention, the first chip 411 is, for example, wire bonded to the substrate 415. As an example, the first chip 411 has at least one first electrical connection pad 441 disposed on the first chip 411. The substrate 415 has at least one second electrical connection pad 443 disposed on the second surface 415b. The first electrical connection pad 441 is connected to the second electrical connection pad 443 via a conductive wire 442, so that the first chip 411 is electrically connected to the substrate 415. The substrate 415 further has several third electrical connection pads 445 disposed on the first surface 415a. The third electrical connection pads 445 are used for electrically connecting the substrate 415 to other electronic elements (not illustrated).

The second chip 412 disposed on the first chip 411 is electrically connected to the first chip 411. Preferably, the second chip 412 is flip-chip bonded to the first chip 411 as shown in FIG. 3. That is, the second chip 412 is electrically to the first chip 411 by at least one flip chip bump 447. The second chip 412 can be wire bonded to the first chip 411 as well.

The second chip 412 is used for receiving the first signal 310 and outputting a second signal to the first chip 411. The first chip 411 receives and processes the second signal, and a third signal is outputted by the first chip 411 according to the received second signal. The third signal can be outputted to other elements (not illustrated) disposed on the substrate 415 for being operated or stored.

The position of the window element 432 corresponds to the position of the second chip 412, and the size of the window element 432 is preferably larger than or equal to the size of the second chip 412. Moreover, the window element 432 is made of a transparent material such as an infrared filter for appropriately filtering the first signal 310 when the first signal 310 passes through the window element 423. The window element 432 is, for example, a plate structure with a smooth surface, so that the first signal 310 would not be scattered or reflected when passing through the window element 423, hence increasing the transmittance and the utilization rate of the first signal 310.

To summarize, after the first signal 310 passes through the window element 432, the first signal 310 contacts with the second chip 412 of the chip module 410. The second chip 412 receives the first signal 310 and outputs the second signal to the first chip 411. The first chip 411 then outputs the third signal according to the second signal, so that the third signal is operated or stored. Furthermore, the first chip 411 can output the processed third signal to the second chip 412 for further reflecting a reflection signal 550 according to the first signal 310 and the third signal. The reflection signal 550 is projected onto a screen (not illustrated) via a projection lens (not illustrated) of the electronic device 200 (as indicated on FIG. 2) for displaying an image.

According to the package structure and the electronic device using the same disclosed in the above embodiment of the invention, the first signal provided by the first signal source passes through the window element of the cover to contact with the second chip, so that the first signal is received by the chip module. The window element is a plate structure with a smooth surface to avoid the first signal being scattered or reflected when passing through the window element. As a result, the chip module has higher efficiency of receiving the first signal, and the utilization rate of the first signal is increased While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A package structure, comprising:
    a chip module for receiving a first signal, comprising:
        a substrate having a first surface, a second surface and an opening, wherein the first surface is opposite to the second surface, and the opening penetrates the first surface and the second surface;
        a heat sink disposed on the first surface of the substrate and covering the opening; and
        a first chip disposed on the heat sink and positioned inside the opening, wherein a bottom surface of the first chip flatly contacts the heat sink; and
        a second chip disposed on the first chip and electrically connected to the first chip, wherein the second chip is wire bonded or flip-chip bonded to the first chip; and
    a cover covering the chip module and having a window element, wherein the first signal passes through the window element to contact with the chip module.

2. The package structure according to claim 1, wherein the window element is a plate structure with a smooth surface.

3. The package structure according to claim 1, wherein the window element is made of a transparent material.

4. The package structure according to claim 3, wherein the window element is an infrared filter.

5. The package structure according to claim 1 wherein the position of the window element corresponds to the position of the second chip.

6. The package structure according to claim 1, wherein the first chip is wire bonded to the substrate.

7. The package structure according to claim 1, wherein the package structure is a land grid array (LGA) package structure or a ball grid array (BGA) package structure.

8. An electronic device, comprising:
    a first signal source for providing a first signal; and
    a package structure, comprising:
        a chip module for receiving the first signal, comprising:
            a substrate having a first surface, a second surface and an opening, wherein the first surface is opposite to the second surface, and the opening penetrates the first surface and the second surface;
            a heat sink disposed on the first surface of the substrate and covering the opening;
            a first chip disposed on the heat sink and positioned inside the opening, wherein a bottom surface of the first chip flatly contacts the heat sink; and
            a second chip disposed on the first chip and electrically connected to the first chip, wherein the second chip is wire bonded or flip-chip bonded to the first chip; and
        a cover covering the chip module and having a window element, wherein the first signal passes through the window element to contact with the chip module.

9. The electronic device according to claim 8, wherein the window element is a plate structure with a smooth surface.

10. The electronic device according to claim 8, wherein the window element is made of a transparent material.

11. The electronic device according to claim 10, wherein the window element is an infrared filter.

12. The electronic device according to claim 8 wherein the position of the window element corresponds to the position of the second chip.

13. The electronic device according to claim 8, wherein the first chip is wire bonded to the substrate.

14. The electronic device according to claim 8, wherein the package structure is a land grid array (LGA) package structure or a ball grid array (BGA) package structure.

* * * * *